(12) United States Patent  (10) Patent No.: US 8,292,077 B2
Andersen  (45) Date of Patent: Oct. 23, 2012

(54) SHOCK ABSORBING SUBSTRATE CONTAINER

(75) Inventor: Christian Andersen, Carver, MN (US)

(73) Assignee: Entegris, Inc., Billerica, MA (US)

( * ) Notice: Subject to any disclaimer, the term of this patent is extended or adjusted under 35 U.S.C. 154(b) by 277 days.

(21) Appl. No.: 12/278,255

(22) PCT Filed: Feb. 5, 2007

(86) PCT No.: PCT/US2007/003220
§ 371 (c)(1),
(2), (4) Date: Dec. 4, 2008

(87) PCT Pub. No.: WO2007/092477
PCT Pub. Date: Aug. 16, 2007

(65) Prior Publication Data
US 2009/0218254 A1   Sep. 3, 2009

Related U.S. Application Data

(60) Provisional application No. 60/765,038, filed on Feb. 3, 2006.

(51) Int. Cl.
*B65D 85/30* (2006.01)
(52) U.S. Cl. .......... 206/453; 206/710; 206/586
(58) Field of Classification Search ........... 206/453, 206/454, 710, 711, 832, 521, 586, 591, 315.11, 206/317; 220/666, 667, 676; 190/37, 122
See application file for complete search history.

(56) References Cited

U.S. PATENT DOCUMENTS

| 2,383,354 | A | * | 8/1945 | Teeter ............... 220/592.04 |
| 3,615,006 | A | * | 10/1971 | Freed .................... 206/454 |
| D259,380 | S | * | 6/1981 | Welsch et al. ............. D6/509 |
| 4,422,547 | A | | 12/1983 | Abe et al. |
| 4,938,360 | A | * | 7/1990 | Wallace ................... 206/586 |
| 4,988,083 | A | * | 1/1991 | Bradley .................. 267/140 |
| 5,149,575 | A | * | 9/1992 | Soifer .................... 428/188 |
| 5,350,150 | A | * | 9/1994 | Fiore ..................... 248/552 |
| D358,255 | S | * | 5/1995 | Sharp et al. ............. D3/262 |
| 5,780,127 | A | | 7/1998 | Mikkelsen |
| D418,978 | S | * | 1/2000 | Pennoyer, Jr. ........... D3/273 |
| 7,677,394 | B2 | * | 3/2010 | Conarro .................. 206/711 |
| 2005/0092603 | A1 | | 5/2005 | Nemoto et al. |
| 2005/0269241 | A1 | | 12/2005 | Brooks et al. |
| 2006/0201958 | A1 | * | 9/2006 | Tieben et al. ............ 220/835 |
| 2006/0237338 | A1 | * | 10/2006 | Nakamae ............... 206/316.1 |
| 2007/0000290 | A1 | | 1/2007 | Fechtel et al. |
| 2007/0131574 | A1 | | 6/2007 | Aoki |

FOREIGN PATENT DOCUMENTS

| DE | 41 03 604 A1 | 8/1992 |
| JP | 58-095812 | 6/1983 |
| JP | 58-158437 U | 10/1983 |
| JP | 08-088266 | 4/1996 |
| JP | 2002-193341 | 7/2002 |
| JP | 2003-267366 | 9/2003 |
| JP | 2005-347734 | 12/2005 |
| WO | WO 2006/009225 A1 | 1/2006 |
| WO | WO 2006094113 A2 * | 9/2006 |

* cited by examiner

*Primary Examiner* — Mickey Yu
*Assistant Examiner* — Ernesto Grano
(74) *Attorney, Agent, or Firm* — Patterson Thuente Christensen Pedersen, P.A.

(57) ABSTRACT

A substrate container is generally comprised of a cover, a base, a latching mechanism, and a substrate retention system. Substrate container has corners with flanges disposed at the corners. Each flange has a hole there through to enhance shock absorption capability by the container, and thus provide greater protection to the substrate.

29 Claims, 8 Drawing Sheets

US 8,292,077 B2

SHOCK ABSORBING SUBSTRATE CONTAINER

RELATED APPLICATIONS

The present application claims the benefit of U.S. Provisional Application No. 60/765,038, filed Feb. 3, 2006, which is incorporated herein in its entirety by reference.

FIELD OF THE INVENTION

This invention relates to containers and, in particular, this invention relates to containers for storing and transporting substrates such as semiconductor wafers and masks.

BACKGROUND

Semiconductor components, such as single semiconductors and integrated circuits, are made using semiconductor wafers. To this end, relatively fragile masks (or reticles) are used to determine dimensions and locations of the structures in the final product. These masks are generally in the form of a substantially planar substrate. During manufacture, small particles of foreign material may settle upon the masks or substrate, hence damaging the mask or the product being manufactured or otherwise interfering with the manufacturing process. These foreign particles are present in the environments in which masks are stored and transported. Because of the fragile nature of masks and the necessity to prevent adherence of foreign particles to the masks, containers are used. These containers serve the dual purpose of protecting the masks from damage and providing a dust-free microenvironment. Similar containers are also used to store and transport other substrates, such as semiconductor wafers and magnetic storage disks.

Because of the fragile nature of such substrates, they can be damaged even when enclosed in such a container if the container is dropped or otherwise roughly handled. As such, a container that can absorb such an impact itself to prevent damage to the substrates contained inside is desirable.

SUMMARY OF THE INVENTION

The invention as depicted in a preferred embodiment is a shock absorbing substrate container. A substrate container is generally comprised of an openable and closeable container with a plurality of corners, a substrate constraint inside the container and a latch. Shock absorbing fingers are positioned at corners of the container and are deflectable or frangible to absorb impacts at the corners. Substrate container can be configured with curved flanges disposed around container and preferably at corners. Each flange has a thinned portion or an aperture there through for providing the flange with desired shock absorbing characteristics. In a preferred embodiment four flanges at four corners will have four apertures defining a finger supported at two ends at apex of each corner.

An advantage of a preferred embodiment is enhanced shock absorption capability by the container, and thus greater substrate protection. If a container is dropped on its side, the holes in flanges allow flanges to deform and/or fracture, increasing the time of impact and absorbing a greater portion of the energy of the impact. The impact energy that is transmitted inside the package can then be further absorbed by pads and cushions supporting the substrates, thereby providing optimal substrate protection.

Another advantage and feature of a preferred embodiment is that the enhanced shock absorbing capabilities provide greater resistance to the container opening, that is, less shock or energy is imparted to the latch mechanism lessening the likelihood of it opening.

Another advantage of a preferred embodiment is ease of manufacture. Flanges and apertures can simply be incorporated into existing molds for containers, thus providing increased shock absorption without increasing the cost and difficulty of manufacture.

Another advantage and feature of preferred embodiments is that the flanges with apertures can be configured to be frangible, fracturing upon impact providing an uneraseable record of the impact. In some instances, the fracturable feature can be intentionally fractured to ineraseably indicate another occurrence other than impact, for example a single use, or a washing, a repair, or some other event of significance. In embodiments wherein the impact record is to be preserved, the fracturable portion of the container can have other shapes than apertured flanges. Thus, an embodiment of the invention is a method for ineraseably recording an event relating to a substrate container comprising the step of intentional fracturing a readily frangible portion of a substrate container. Said frangible area can be on a corner flange or other suitable area.

A feature and advantage of preferred embodiments is that a method of manufacturing a shock absorbing container is provided wherein the container has a corner positioned flange and an aperture therein for allowing deformation or fracturing upon impact with said corner.

A feature and advantage of preferred embodiments is that a method of modifying a container with a flanges in order to provide improved impact resistance with said flanges is provided and comprises adding holes to said flanges for allowing improved deformation and shock absorption capabilities at said flanges.

A feature and advantage of the invention is that a method of providing protection to masks in use and storage in semiconductor fabrication facilities is provided wherein a mask container with apertured flanged corners is utilized to contain and store masks.

BRIEF DESCRIPTION OF THE DRAWINGS

The invention may be more completely understood in consideration of the following detailed description of various embodiments of the invention in connection with the accompanying drawings, in which:

FIG. 6 is a perspective view of a shock absorbing substrate container according to an embodiment of the present invention.

DETAILED DESCRIPTION

Figure 1:
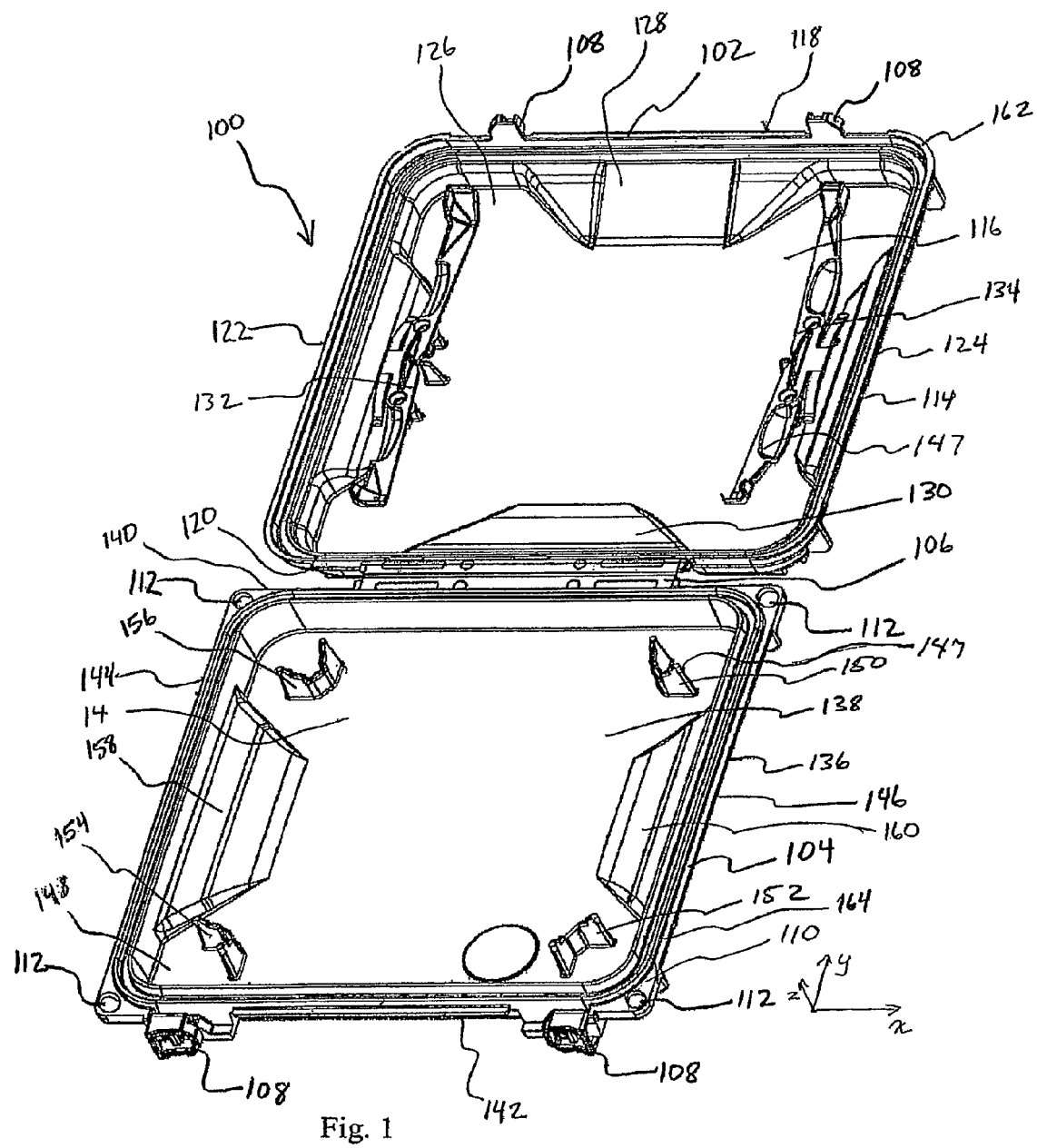
FIG. 1 is a perspective view of the inside of an opened shock absorbing substrate container according to an embodiment of the present invention.
Figure 2:
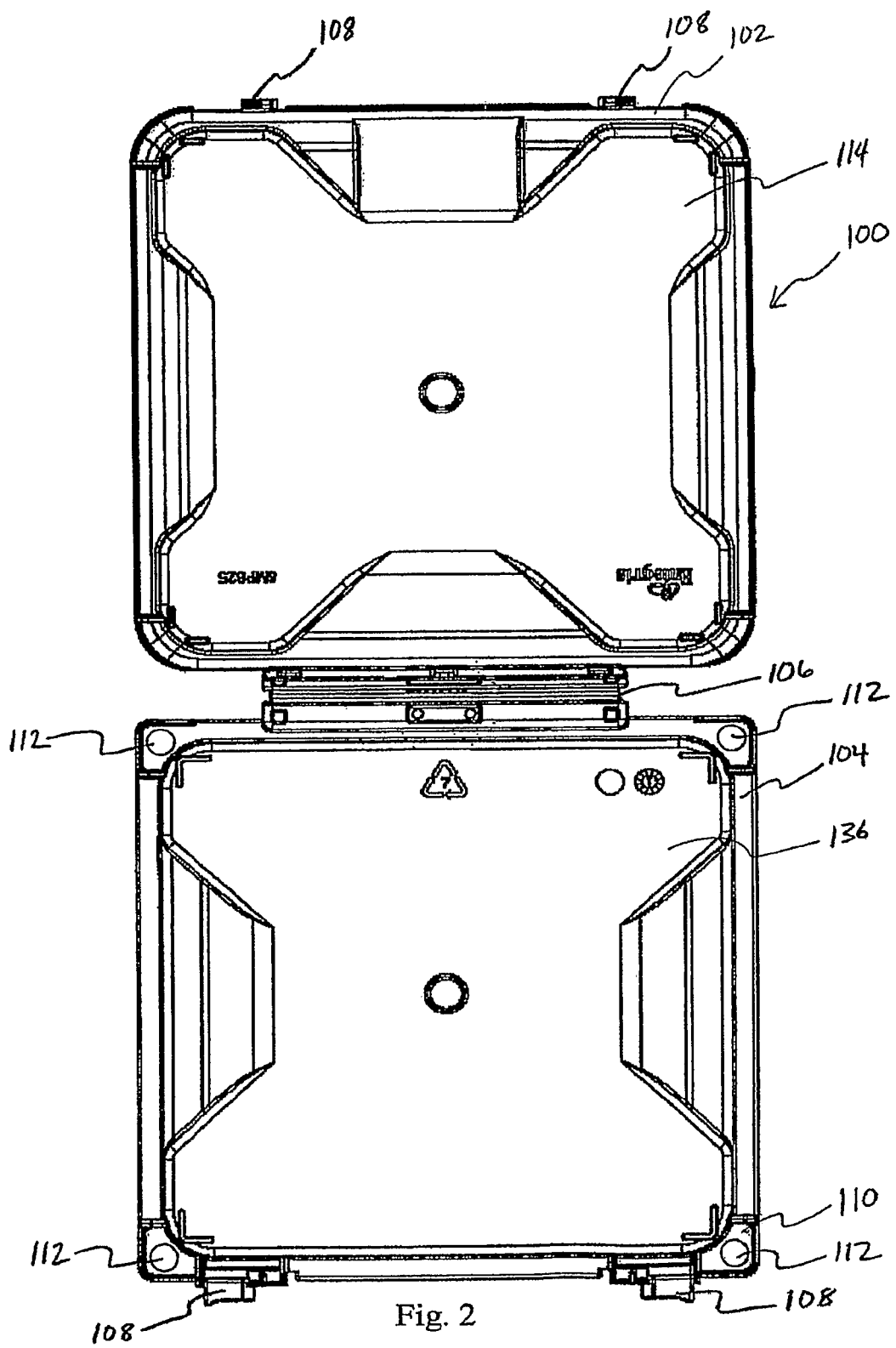
FIG. 2 is a top view of the outside of an opened shock absorbing substrate container according to an embodiment of the present invention.

Referring to FIGS. 1-3*a*, one embodiment of a shock absorbing substrate container of the instant invention is depicted generally at 100 and includes an upper member such as a lid 102, a lower member such as a base 104, a hinge 106, and a latching mechanism 108. The substrate in the embodiment is a mask or reticle for manufacturing semiconductors. In other embodiments the substrate may be semiconductor wafers or magnetic disks.

The lid 102, in turn, has a shell 114 with a generally planar top 116, opposed front and back sides 118 and 120 and opposed lateral sides 122 and 124, thereby defining a lid cavity 126. Disposed within the lid cavity 126 are longitudinally inclined raised surfaces 128 and 130 and laterally opposed mask cushions 132 and 134. The mask cushions are part of a restraint system 147 for the mask.

The base 104 has a shell 136 having a generally planar bottom 138, opposed front and back sides 140 and 142, and generally opposed lateral sides 144 and 146, thereby defining a base cavity 148. The restraint system 147 for the substrate, that is the mask, further comprises posts 150, 152, 154, and 156 that extend from the bottom 138 proximate the four corners of the base cavity 148 and define a substrate placement position 149 or pocket. Laterally opposed inclined raised surfaces 158 and 160 are at the lateral sides 144 and 146, respectively.

A rim 162 is defined at the periphery of the lid 102 and a ledge 164 is defined at a periphery of the base 104. The rim 162 sealingly contacts the ledge 164 when the container 100 is closed. The ledge 164 can include four flange portions 110 located at each of the corners of the base 104. Each flange portion 110 further includes a hole or aperture 112 there through as can be seen in FIG. 3. Holes 112 are preferably not obstructed by the lid 102 when the container 100 is closed.

In use, a substrate, such as a mask, is placed in the base cavity 148 so as to be confined therein by the posts 150, 152, 154, 156.

Holes 112 and flanges 110 are disposed on base 104 in order to absorb the shock if container 100 is dropped on its side, thereby protecting any substrates contained therein from damage. When the force from a drop is imparted on container 100, hole 112 allows flange 100 to deform 112, thereby extending the impact time and effectively absorbing the brunt of the impact. This results in reduced force being passed on to the interior of the container 100, which may be absorbed by the cushions 132, 134 in the lid and resiliency in the posts leaving the substrates undamaged. In addition, muted force is transmitted to the latching mechanism 108, lessening the likelihood that the container 100 will pop open upon impact.

Figure 3A:
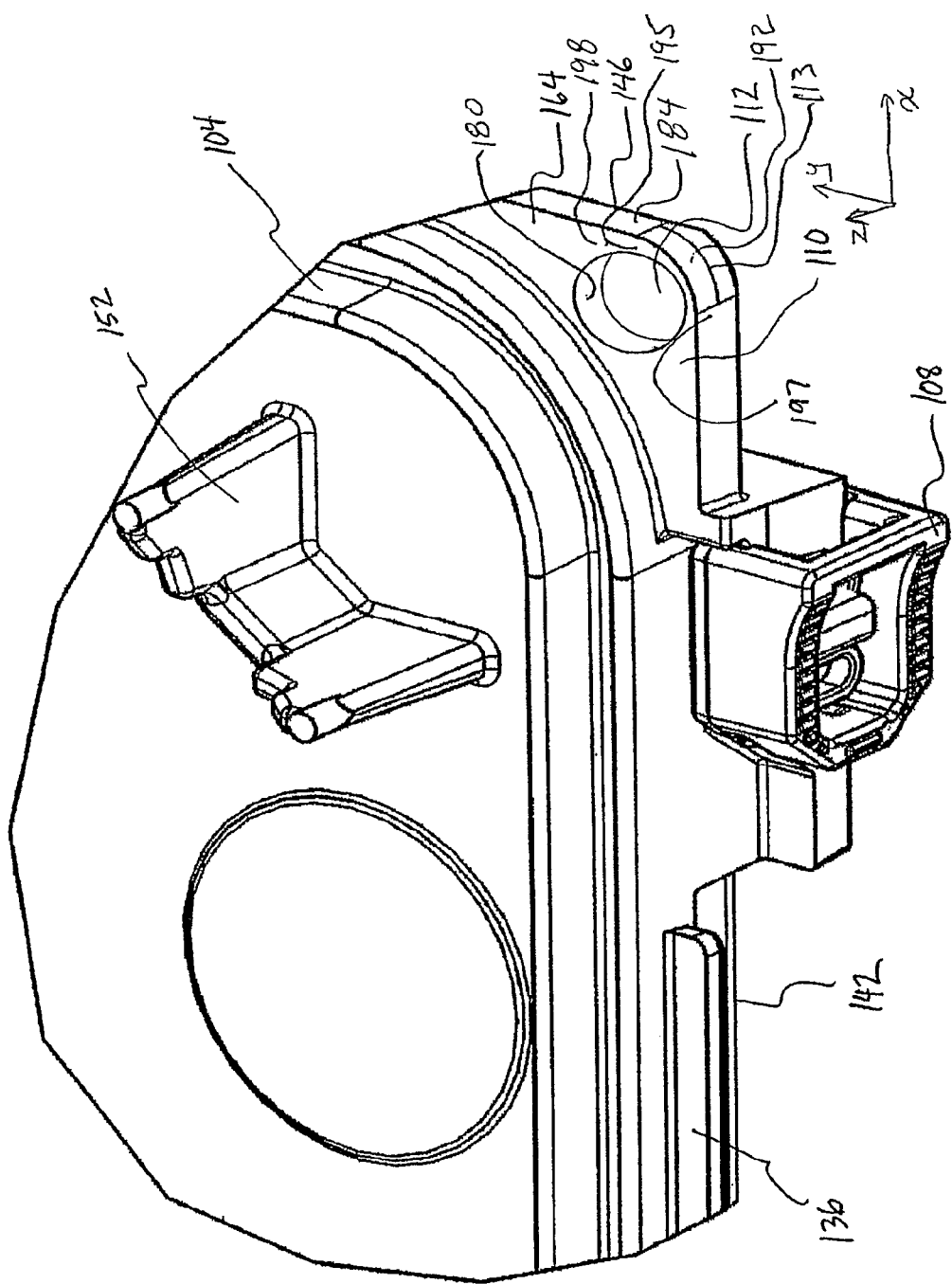
FIG. 3a is a partial view of a shock absorbing substrate container according to an embodiment of the present invention.
Figure 3B:
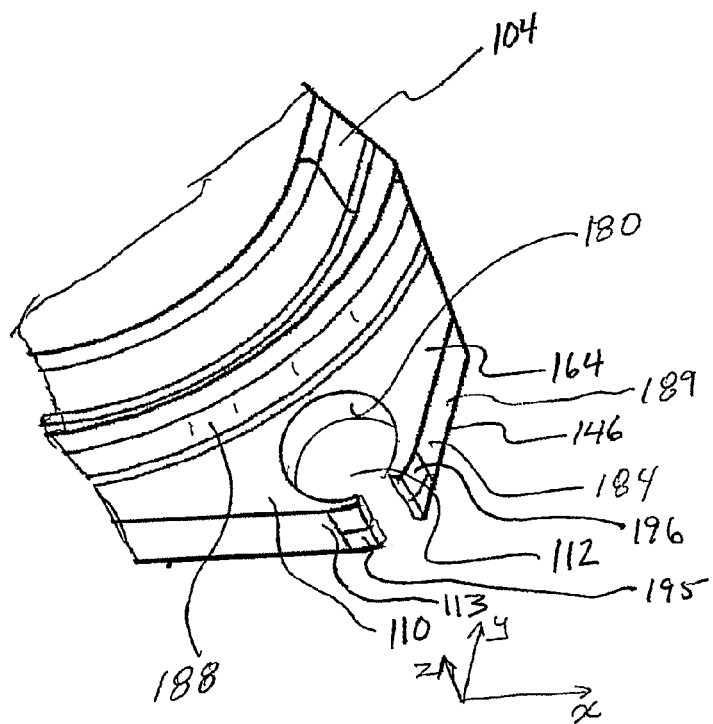
FIG. 3b is a partial view of a shock absorbing substrate container according to an embodiment of the present invention.
Figure 3C:
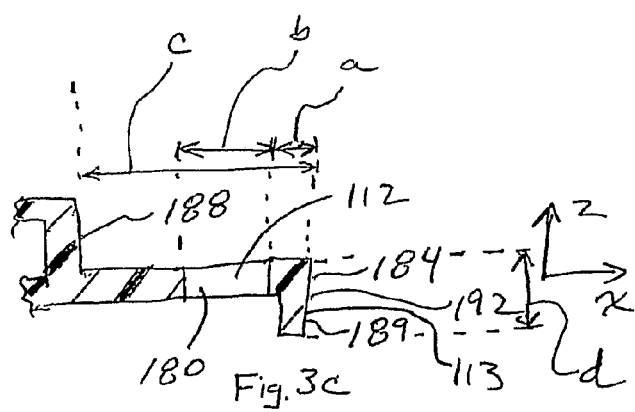
FIG. 3c is a cross-sectional view of a apertured flange according to an embodiment of the present invention.

Holes 112 must be large enough and configured to permit flanges 110 to deform or fracture upon impact. However, if holes 112 are too large, flanges 110 will deform too easily and/or be unable to support the weight of the container and contents which would not be desirable in many cases. Preferably, the shortest distance from the perimeter of the hole to the perimeter of the flange is smaller than the radius of the hole or half the distance across the aperture for non circular holes. In preferred embodiments, the thickness of the material from the boundary of the hole 112 to the outer periphery 113 of the flange is in the range of 0.030 inches to 0.400 inches. In a more preferred embodiment, the thickness of the material from the hole to the outer periphery of the flange is 0.050 to 0.300 inches. The hole 112 size and shape can vary, depending on the size of the flanges 110 and the weight and size of the container 100, as necessary to provide the proper amount of deformation upon loading such as by a drop of the container. In preferred embodiments the radius of the hole when circular ranges from 0.125 inches to 0.300 inches. In other embodiments the hole can have a length dimension where it is non-circular of up to about an inch. For example a curved slot of 0.100 to 0.200 inches wide could follow the curved corner periphery. In preferred embodiments the flange is an integral portion of the container, conveniently the base portion but also the cover or lid is suitable. In certain cases it may be desirable to have multiple apertures at each flange. In the preferred embodiments, the apertures serve no purpose other than effectuating and enhancing the shock absorption capability of the container when receiving impacts at said corners. Referring to FIGS. 3*a*, 3*b*, and 3*c*, note that the apertures can be open or closed. "Closed" being where aperture has a continuous perimeter or boundary 180 that does not extend to the outer periphery 184 of the flange as shown in FIG. 3*a*. "Open" being where the boundary of the aperture does extend to the periphery of the flange as shown in FIG. 3*b*.

Also note that in preferred embodiments the flange is horizontally extending (in the x-y axis) and extends from a vertical wall 188 (substantially parallel to the z axis) of the container. The flange is preferable of uniform thickness except at the periphery 113 where the thickness may increase at the peripheral lip 189. Referring to FIG. 3*c*, in a preferred embodiments the portion of the edge of the flange that is apertured compared to the distance from the inside perimeter of the aperture to the outer periphery of the flange is at lease about 50% and preferably about at least 70% of the corner where the aperture is closed measured through a line taken where the aperture is closest to the flange periphery. This may or may not be at the apex 192 of the corner of the flange. Stated in other terms, b/(a+b) is at least about 0.5 and preferably about at least 0.7. Moreover, taken at a line through the widest part of the aperture, the portion of the horizontal flange extending outwardly from the vertical wall 188 that is apertured compared to the entire distance is preferably at least 40%, and more preferably at least about 60%. In other words, b/c is preferably at least 0.4 and more preferably at least about 0.6.

Referring to FIGS. 3*a* and 3*b*, the aperture 112 and the periphery 113 in the flange define at least one either resilient or frangible elongate finger member 195. The finger 195 is illustrated as integrally connected to the flange at both ends 197, 198 of the finger. Where the aperture is open, a second elongate finger member 196 may be defined. Depending on the material and specific configuration, these fingers can be designed to either fracture or bend upon impact. In a preferred embodiment, the fingers have a width, identified with the letter a in FIG. 3*c*, measured in a direction parallel to the plane of the flange (the x-y plane), and a height, measured in the direction transverse to the plane of the flange and designated with the letter d, that is in the z direction. In a preferred embodiment, the width dimension is less than the height dimension at the point of minimal width or at the apex of the corner.

Although described with respect to one specific container configuration, it will be appreciated by one of skill in the art that a shock absorbing substrate container according to the present invention can be created by taking any similar substrate container configuration and adding flanges and creating holes there through. A container for storing masks that can be easily modified according to the present invention is disclosed in co-pending application Ser. No. 11/364,812, which is hereby incorporated by reference.

Figure 4:
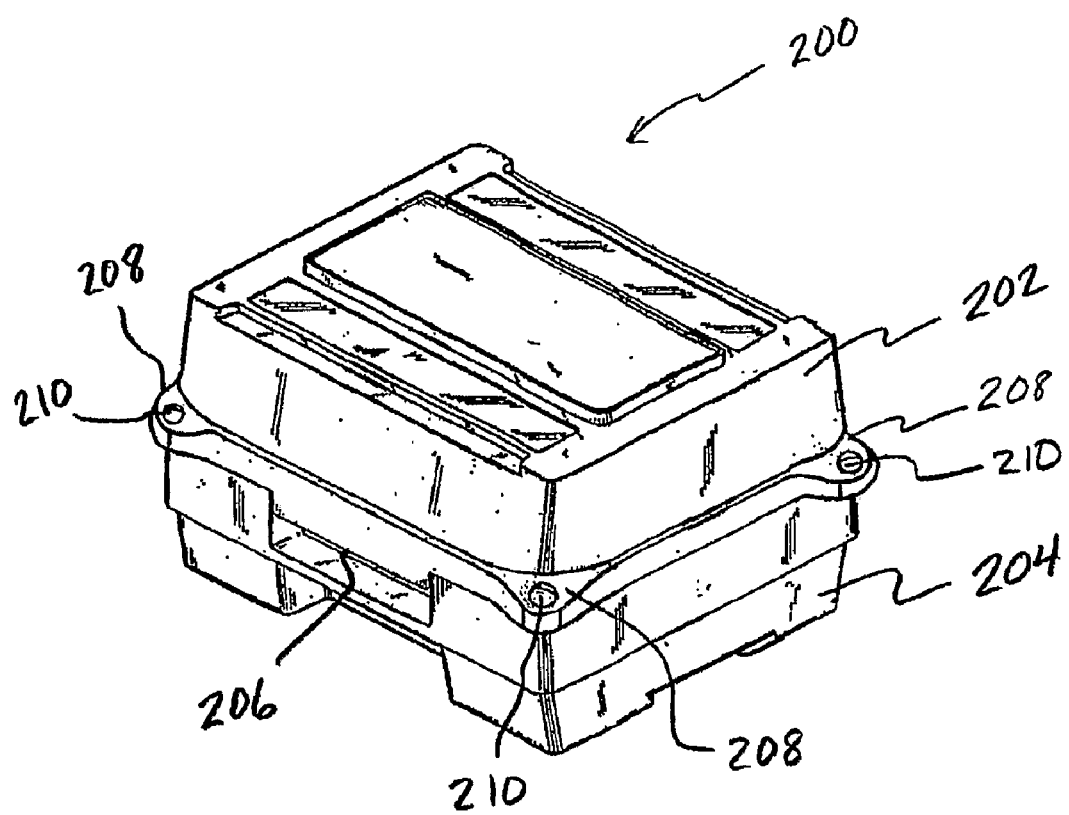
FIG. 4 is a perspective view of a shock absorbing substrate container according to an embodiment, of the present invention.

Referring to FIGS. 4-7, there can be seen various other shock absorbing substrate containers according to embodiments of the present invention. In FIG. 4, a substrate shipper, for semiconductor wafers is illustrated. This shock absorbing package 200 includes an upper member 202 and a lower member 204 that define an interior region in which substrates can be stored. Such a container is described in U.S. Pat. No. 4,793,488 owned by the owner of the instant invention. Said patent is incorporated herein by reference. An H-bar wafer cassette may be the support system for the substrates, that is, the wafers. Upper member 202 and lower member 204 can be sealingly connected by a latching mechanism 206. Package 200 further includes flanges 208 with apertures 210 there through to absorb the impact if the package 200 is dropped.

Figure 5:
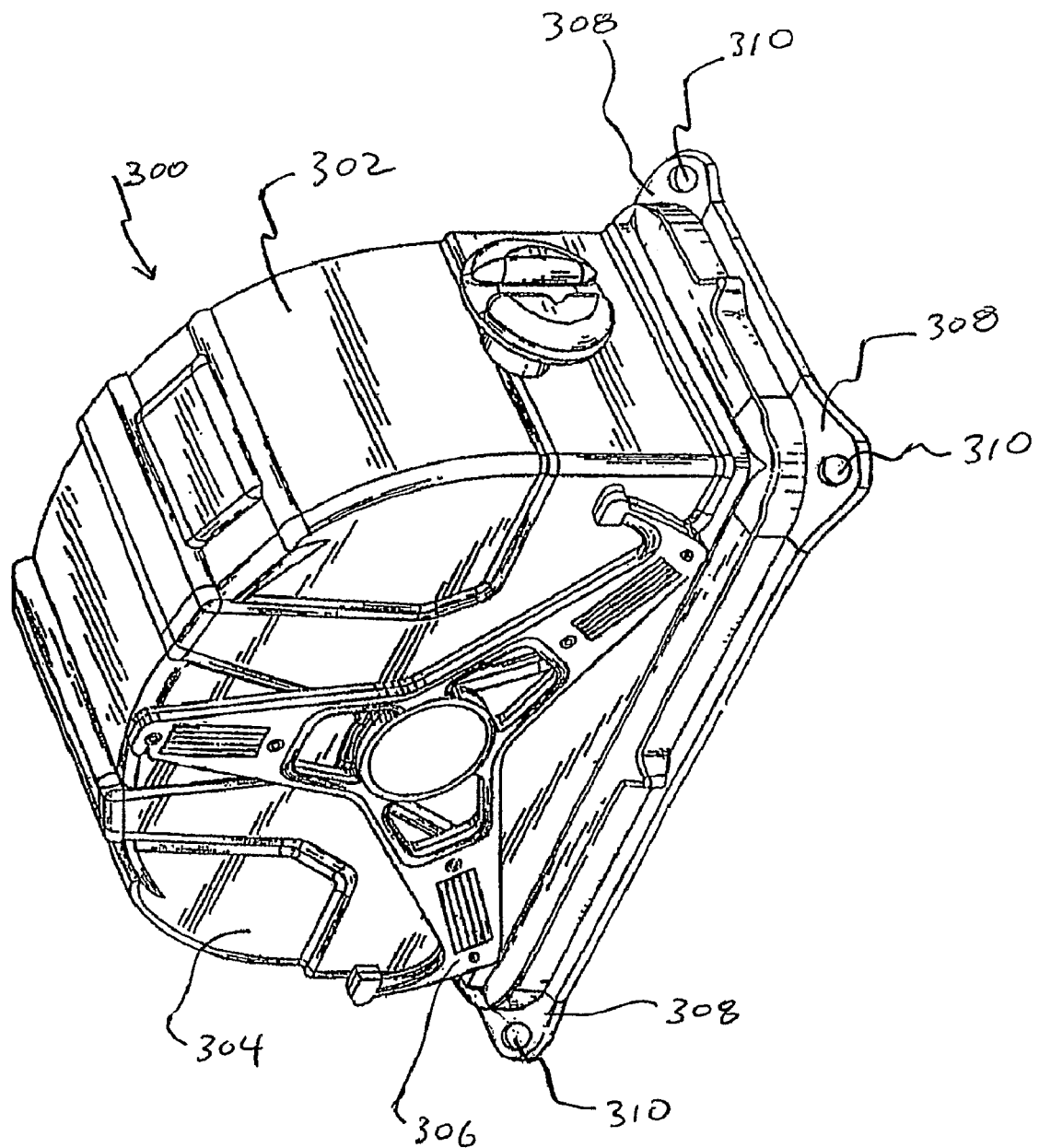
FIG. 5 is a perspective view of a shock absorbing substrate container according to an embodiment of the present invention.
Figure 9:
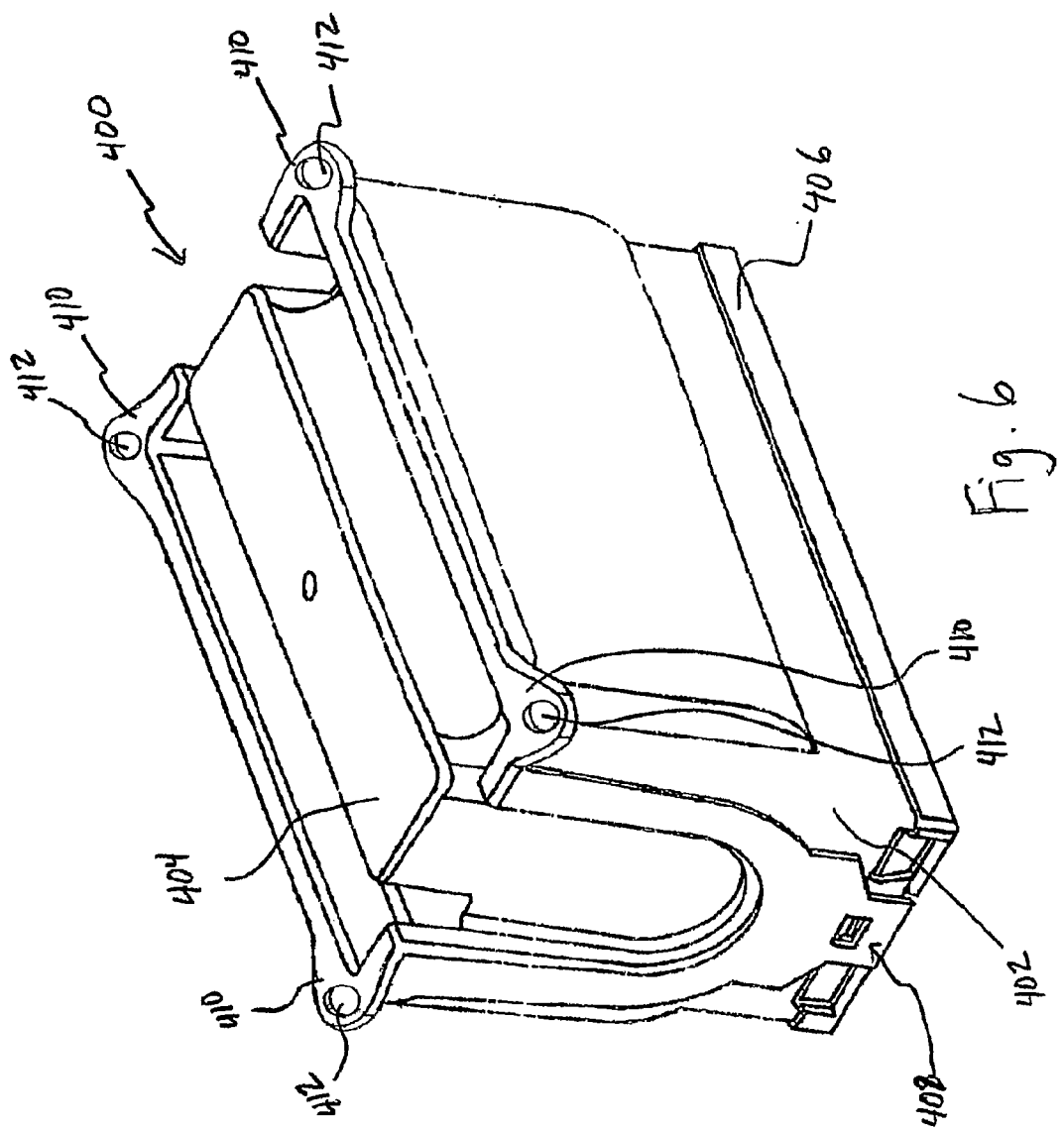

Referring to FIG. 5, a shock absorbing container 300 includes a shell 302 that can contain substrates. The container is typically known as a FOUP which is an acronym for front opening unified pod. Such a container is illustrated in U.S. Pat. No. 5,944,194 and is owned by the owner of the instant invention. Said patent is incorporated herein by reference. Container 300 is sealable with a door 304 and a latching mechanism 306. The support system for the substrates therein comprises a series of shelves and wafer restrainst on the inside of a front door. Container 300 further includes flanges 308 with apertures there through 310 to absorb the impact if the container 300 is dropped.

Depicted in FIG. 6 is a shock absorbing substrate carrier 400 including a cassette 402 for container substrates, a top cover 404, and a bottom cover 406. The substrates for this type of shipper are magnetic disks and such a shipper is illustrated in U.S. Pat. No. 6,902,059, owned by the owner of the instant invention. Said patent is incorporated herein by reference. The support system for substrates in this embodiment comprises a series of teeth defining slots and a disk "cushion" on the top cover. A latching mechanism 408 can seal the top cover 404 and bottom cover 406 to the cassette 402. Carrier 400 further includes flanges 410 with apertures there through 412 to absorb the impact if the carrier 400 is dropped.

Figure 7:
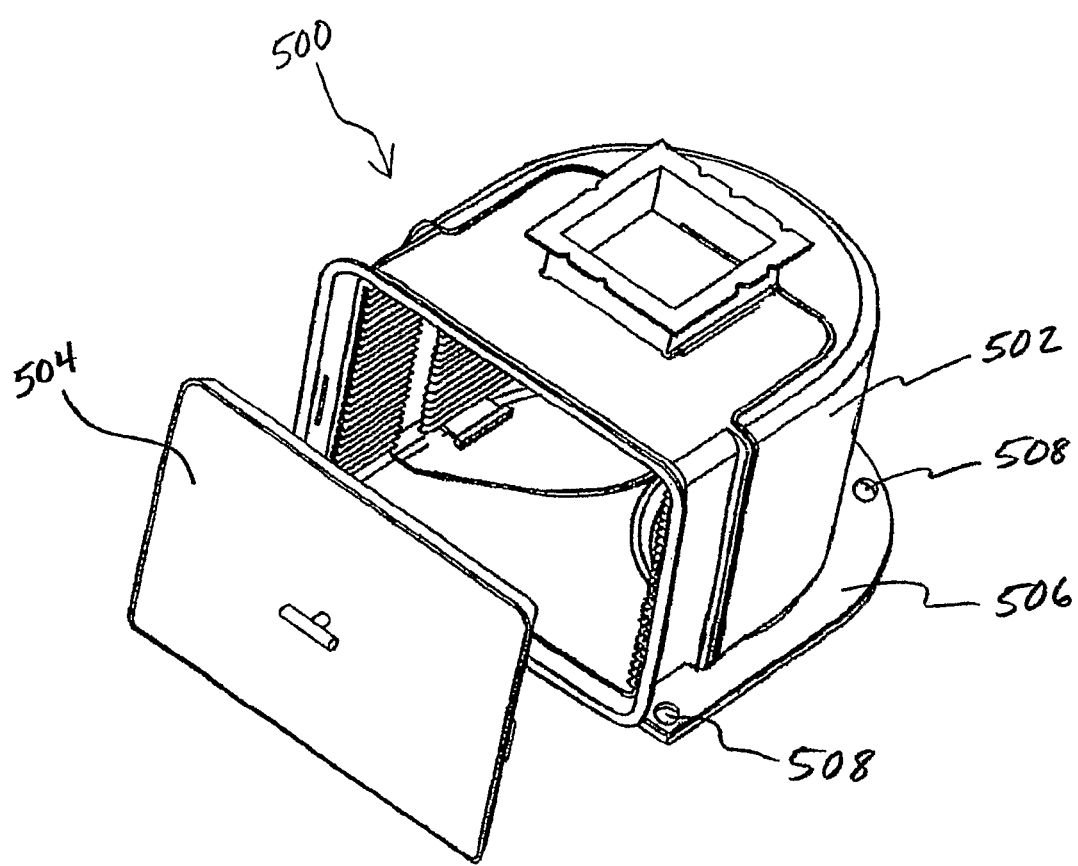
FIG. 7 is a perspective view of a shock absorbing substrate container according to an embodiment of the present invention.

Referring to FIG. 7, a shock absorbing substrate carrier 500 is depicted. Carrier 500 includes a container portion 502 that is sealable with a door 504. Carrier 500 further includes a flanged portion 506 that includes a plurality of apertures 508 there through to absorb the impact if the carrier 500 is dropped.

Substrate container may be injection molded, though one of skill in the art will recognize that other processes can be used. Any existing substrate container mold can be easily modified to impart the flanges and holes of the present invention to provide a shock absorbing substrate container. Alternatively, holes may be created by a separate process after the base is molded.

Suitable materials for the substrate container include acrylonitrile-butadiene-styrene (ABS), optionally with a static dissipative property, e.g., StatPro 435™ available from Entegrisr, Inc. the owner of the instant invention. However, a person of ordinary skill in the art will routinely substitute other polymers for specific applications. Polypropylenes and polycarbonates are examples.

Because numerous modifications of this invention may be made without departing from the spirit thereof, the scope of the invention is not to be limited to the embodiments illustrated and described. Rather, the scope of the invention is to be determined by the appended claims and their equivalents.

What is claimed is:

1. A shock absorbing substrate container having a low profile with four corners, the container comprising:
    a polymer lid comprising a shell with four sides joined by four corners, each corner defined by two adjacent sides;
    a polymer base comprising a shell with four sides joined by four corners, each corner defined by two adjacent sides;
    a hinge connecting the lid and the base,
    a restraint system for a substrate therein;
    a latch mechanism for securing the lid to the base and sealing the container relative to the outside environment;
    a flange disposed around and extending horizontally outwardly from the shell of one of the lid and the base, the flange extending from a plurality of sides of the one of the lid and the base and forming four corner flanges, one at each corner on said one of the base and the lid, the four corner flanges unitary with the shell of the said one of the lid and the base, each corner flange disposed at and projecting horizontally outwardly from one of the corners and extending around said one of said corners such that a portion of the corner flange extends from each of the adjacent sides that define the one of said corners, each corner flange further being generally parallel to a top surface of the lid and a bottom surface of the base, and wherein the flange extends outwardly from the shell of the one of the base and the lid a greater distance at the corners than along the sides; and
    an aperture through each of the one or more corner flanges providing shock absorption capabilities at said corners, the aperture positioned adjacent the apex of the corner intermediate the adjacent sides, each aperture defining a finger at each corner in either the base or the lid, each of said fingers being resilient or frangible for absorbing shock upon an impact at each of said corners.

2. The shock absorbing substrate container of claim 1, wherein the shortest distance between the perimeter of the apertures and the perimeter of the corner flanges is less than the radius of the apertures.

3. The shock absorbing substrate container of claim 1, wherein the shortest distance between the perimeter of the apertures and the perimeter of the corner flanges is less than 3/16 of an inch.

4. The shock absorbing substrate container of claim 1, wherein the apertures serve no function in securing the lid to the base.

5. The shock absorbing substrate container of claim 1, wherein the apertures are not obstructed by the lid when the lid is secured to the base.

6. The shock absorbing substrate container of claim 1, wherein the container is configured to resiliently confine one or more substrates contained therein when the lid is secured to the base.

7. The shock absorbing substrate container of claim 1, wherein the container is comprised entirely of the same polymer.

8. The shock absorbing substrate container of claim 1, wherein the polymer is acrylonitrile-butadiene-styrene.

9. The shock absorbing substrate container of claim 1, wherein the four sides of the one of the lid and the base substantially defines a rectangle, the four corner flanges extending beyond the rectangle.

10. A shock absorbing substrate container formed of a polymer comprising:
- a polymer upper member having a generally planar top, opposed front and back sides, and opposed lateral sides defining an upper cavity;
- a polymer lower member having a generally planar bottom, opposed front and back sides, and opposed lateral sides defining a lower cavity;
- a latching mechanism for securing the upper member to the lower member;
- a flange formed unitarily with and extending outwardly and horizontally from and around the container along at least one of the upper member and lower member;
- four corners with four corner flange portions formed unitarily with the flange, one corner flange portion on and projecting outwardly from each corner, said corner flange portions unitary with said at least one of the upper member or lower member, each corner flange portion extending around said corner, each corner flange portion having an aperture adjacent the respective apex of each corner to define a finger at each corner, each of said fingers being resilient or frangible for providing shock absorption when the respective corner is impacted, and wherein each corner flange portion has a generally horizontal top surface and a generally horizontal bottom surface defining the thickness of the flange, and wherein the corner flange portions extend outwardly from the container a greater distance than the flange extends outwardly between the corners.

11. The shock absorbing substrate container of claim 10, further comprising a hinge connecting the upper member and the lower member.

12. The shock absorbing substrate container of claim 10, wherein each corner flange portion has a perimeter, and wherein the shortest distance between the perimeter of the apertures and the perimeter of the corner flange portions is less than the radius of the apertures.

13. The shock absorbing substrate container of claim 10, wherein each corner flange portion and each aperture have a perimeter, and wherein the shortest distance between the perimeter of each aperture and the perimeter of the respective corner flange portion is less than 3/16 of an inch.

14. The shock absorbing substrate container of claim 10, wherein each corner flange portion on each corner is rounded and each aperture is circular.

15. The shock absorbing substrate container of claim 10, wherein the apertures are not obstructed by the upper member when the upper member is secured to the lower member.

16. The shock absorbing substrate container of claim 10, wherein the corner flange portions are generally parallel to the top of the upper member and the bottom of the lower member.

17. The shock absorbing substrate container of claim 10, wherein the lower member has four corners, and wherein one of the corner flange portions is disposed at each corner.

18. The shock absorbing substrate container of claim 10, wherein the container is configured to resiliently confine one or more substrates contained therein when the upper member is secured to the lower member.

19. The shock absorbing substrate container of claim 10, wherein the container is comprised of a polymer.

20. The shock absorbing substrate container of claim 10, wherein the polymer is acrylonitrile-butadiene-styrene.

21. The shock absorbing substrate container of claim 10, wherein the opposed front and back sides and the opposed lateral sides of the at least one of the upper member and lower member substantially defines a rectangle, the four corner flanges extending beyond the rectangle.

22. A shock absorbing substrate container comprising:
- an upper member having a generally planar top, opposed longitudinal sides, and opposed lateral sides defining an upper cavity;
- a lower member having a generally planar bottom, opposed longitudinal sides, and opposed lateral sides defining a lower cavity;
- a latching mechanism for securing the upper member to the lower member;
- a flange portion having generally horizontal top and bottom surfaces unitary with and disposed around and projecting horizontally outwardly from the container along at least one of the upper member and the lower member, the flange portion including corner flange portions at corners of the container, each corner having an apex, the corner flange portions formed unitarily with the flange portion and having generally horizontal top and bottom surfaces projecting horizontally outwardly from the container, and wherein the corner flange portions extend outwardly from the container a greater distance than the flange portion extends outwardly between the corners; and
- an aperture through each of the one or more corner flange portions, wherein the shortest distance between the perimeter of each of the apertures and the perimeter of each of the respective corner flange portions is less than the radius of the apertures to define a finger at each of the respective corner flange portions, each finger being resilient or frangible for absorbing shock upon an impact at each of the respective corner flange portions, wherein the apertures serve no function in securing the upper member to the lower member and are not obstructed by the upper member when the upper member is secured to the lower member.

23. The shock absorbing substrate container of claim 22, further comprising a hinge connecting the upper member to the lower member.

24. The shock absorbing substrate container of claim 22, wherein the shortest distance between the perimeter of the apertures and the perimeter of the corner flanges is less than 3/16 of an inch.

25. The shock absorbing substrate container of claim 22, wherein the container is configured to resiliently confine one or more substrates contained therein when the upper member is secured to the lower member.

26. The shock absorbing substrate container of claim 22, wherein the container is comprised of a polymer.

27. The shock absorbing substrate container of claim 22, wherein the polymer is acrylonitrile-butadiene-styrene.

28. The shock absorbing substrate container of claim 22, wherein the opposed longitudinal sides and the opposed lateral sides of the at least one of the upper member and lower member substantially defines a rectangle, the corner flange portions extending beyond the rectangle.

29. A shock absorbing substrate container having a low profile with four corners, the container comprising:
- a polymer lid comprising a shell with four sides joined by four corners, each corner defined by two adjacent sides;
- a polymer base comprising a shell with four sides joined by four corners, each corner defined by two adjacent sides;
- a hinge connecting the lid and the base,
- a restraint system for a substrate therein;

a latch mechanism for securing the lid to the base and sealing the container relative to the outside environment;

a flange disposed around and extending horizontally outwardly from the shell of one of the lid and the base, the flange extending from a plurality of sides of the one of the lid and the base and forming four corner flanges, one at each corner on said one of the base and the lid, the four corner flanges unitary with the shell of the said one of the lid and the base, each corner flange disposed at and projecting horizontally outwardly from one of the corners and extending around said one of said corners such that a portion of the corner flange extends from each of the adjacent sides that define the one of said corners, each corner flange further being generally parallel to a top surface of the lid and a bottom surface of the base; and an aperture through each of the one or more corner flanges providing shock absorption capabilities at said corners, the aperture positioned adjacent the apex of the corner intermediate the adjacent sides, each aperture defining a finger at each corner in either the base or the lid, each of said fingers being resilient or frangible for absorbing shock upon an impact at each of said corners.

* * * * *